United States Patent
Marrow (10) Patent No.: US 9,047,213 B2
(45) Date of Patent: Jun. 2, 2015

(54) CODING ARCHITECTURE FOR MULTI-LEVEL NAND FLASH MEMORY WITH STUCK CELLS

(71) Applicant: SK hynix memory solutions inc., San Jose, CA (US)

(72) Inventor: Marcus Marrow, San Jose, CA (US)

(73) Assignee: SK hynix memory solutions inc., San Jose, CA (US)

( * ) Notice: Subject to any disclaimer, the term of this patent is extended or adjusted under 35 U.S.C. 154(b) by 0 days.

(21) Appl. No.: 14/213,446

(22) Filed: Mar. 14, 2014

(65) Prior Publication Data

US 2014/0281791 A1   Sep. 18, 2014

Related U.S. Application Data

(63) Continuation of application No. 12/313,512, filed on Nov. 19, 2008, now Pat. No. 8,719,670.

(60) Provisional application No. 61/126,937, filed on May 7, 2008.

(51) Int. Cl.
| | |
|---|---|
| *H03M 13/00* | (2006.01) |
| *G11C 29/00* | (2006.01) |
| *G06F 11/10* | (2006.01) |
| *H03M 13/29* | (2006.01) |
| *H03M 13/35* | (2006.01) |
| *H03M 13/25* | (2006.01) |
| *H03M 13/11* | (2006.01) |
| *H03M 13/15* | (2006.01) |

(52) U.S. Cl.
CPC ........ *G06F 11/1072* (2013.01); *G06F 11/1008* (2013.01); *H03M 13/29* (2013.01); *H03M 13/2906* (2013.01); *H03M 13/2978* (2013.01); *H03M 13/356* (2013.01); *H03M 13/1102* (2013.01); *H03M 13/1515* (2013.01); *H03M 13/251* (2013.01); *H03M 13/1105* (2013.01); *H03M 13/2927* (2013.01)

(58) Field of Classification Search
CPC ........... G06F 11/1072; G06F 11/1008; H03M 13/29; H03M 13/2906; H03M 13/2978; H03M 13/356
USPC ................................... 714/755, 773
See application file for complete search history.

(56) References Cited

U.S. PATENT DOCUMENTS

| | | | | |
|---|---|---|---|---|
| 3,078,443 | A * | 2/1963 | Rose | 714/774 |
| 4,336,612 | A * | 6/1982 | Inoue et al. | 714/755 |
| 4,677,625 | A * | 6/1987 | Betts et al. | 714/792 |
| 4,677,626 | A * | 6/1987 | Betts et al. | 714/792 |

(Continued)

FOREIGN PATENT DOCUMENTS

WO   WO 2006075929 A1 *  7/2006   ............ H03M 13/11

*Primary Examiner* — Joseph D Torres
(74) *Attorney, Agent, or Firm* — Van Pelt, Yi & James LLP (57) ABSTRACT

Encoded least significant bit (LSB) values are generated for a cell based at least in part on a readback value for the cell. The encoded LSB values is decoded in order to obtain one or more decoded LSB values. Encoded most significant bit (MSB) values are generated for the cell based at least in part on (1) the readback value for the cell and (2) the decoded LSB values. The encoded MSB values are decoded in order to obtain one or more decoded MSB values, wherein the bit positions of the decoded LSB values do not overlap with the bit positions of the decoded MSB values.

18 Claims, 7 Drawing Sheets

(56) References Cited

U.S. PATENT DOCUMENTS

| | | | |
|---|---|---|---|
| 5,124,979 A * | 6/1992 | Matui | 370/496 |
| 5,408,499 A * | 4/1995 | Sasaki | 375/286 |
| 5,416,804 A * | 5/1995 | Khaled et al. | 375/341 |
| 5,559,956 A * | 9/1996 | Sukegawa | 714/6.13 |
| 5,719,591 A * | 2/1998 | Callahan et al. | 345/98 |
| 5,721,745 A * | 2/1998 | Hladik et al. | 714/755 |
| 5,734,962 A * | 3/1998 | Hladik et al. | 455/12.1 |
| 5,812,601 A * | 9/1998 | Schramm | 375/262 |
| 5,983,385 A * | 11/1999 | Khayrallah et al. | 714/755 |
| 6,023,783 A * | 2/2000 | Divsalar et al. | 714/792 |
| 6,029,264 A * | 2/2000 | Kobayashi et al. | 714/755 |
| 6,044,485 A * | 3/2000 | Dent et al. | 714/774 |
| 6,182,264 B1 * | 1/2001 | Ott | 714/774 |
| 6,192,501 B1 * | 2/2001 | Hladik et al. | 714/786 |
| 6,192,503 B1 * | 2/2001 | Chennakeshu et al. | 714/796 |
| 6,233,711 B1 * | 5/2001 | Murayama et al. | 714/786 |
| 6,263,466 B1 * | 7/2001 | Hinedi et al. | 714/755 |
| 6,304,995 B1 * | 10/2001 | Smith et al. | 714/786 |
| 6,304,996 B1 * | 10/2001 | Van Stralen et al. | 714/796 |
| 6,397,367 B1 * | 5/2002 | Park et al. | 714/786 |
| 6,400,728 B1 * | 6/2002 | Ott | 370/465 |
| 6,434,718 B1 * | 8/2002 | Kawahara et al. | 714/774 |
| 6,477,678 B1 * | 11/2002 | Fang et al. | 714/755 |
| 6,484,283 B2 * | 11/2002 | Stephen et al. | 714/786 |
| 6,560,362 B1 * | 5/2003 | Piret et al. | 382/232 |
| 6,657,895 B2 * | 12/2003 | Pagliato et al. | 365/185.21 |
| 6,658,605 B1 * | 12/2003 | Yoshida et al. | 714/702 |
| 6,665,831 B1 * | 12/2003 | Yoshida et al. | 714/774 |
| 6,704,368 B1 * | 3/2004 | Nefedov | 375/265 |
| 6,731,178 B2 * | 5/2004 | Gailhard et al. | 331/57 |
| 6,735,735 B1 * | 5/2004 | Ohira et al. | 714/776 |
| 6,738,942 B1 * | 5/2004 | Sridharan et al. | 714/755 |
| 6,829,297 B2 * | 12/2004 | Xia et al. | 375/232 |
| 6,859,906 B2 * | 2/2005 | Hammons et al. | 714/786 |
| 7,054,377 B1 * | 5/2006 | Betts | 375/265 |
| 7,058,140 B2 * | 6/2006 | Smart et al. | 375/316 |
| 7,085,986 B2 * | 8/2006 | Nefedov | 714/755 |
| 7,219,291 B2 * | 5/2007 | Adde et al. | 714/755 |
| 7,242,726 B2 * | 7/2007 | Cameron et al. | 375/295 |
| 7,254,769 B2 * | 8/2007 | Kim et al. | 714/774 |
| 7,292,654 B2 * | 11/2007 | Simon et al. | 375/329 |
| 7,296,216 B2 * | 11/2007 | Shen et al. | 714/801 |
| 7,333,571 B2 * | 2/2008 | Simon et al. | 375/329 |
| 7,436,902 B2 * | 10/2008 | Shen et al. | 375/308 |
| 7,530,011 B2 * | 5/2009 | Obuchii et al. | 714/794 |
| 7,653,858 B2 * | 1/2010 | Nefedov | 714/755 |
| RE41,498 E * | 8/2010 | Park et al. | 714/755 |
| 7,889,707 B2 * | 2/2011 | Niu et al. | 370/342 |
| 7,958,426 B2 * | 6/2011 | Betts | 714/755 |
| 7,975,192 B2 * | 7/2011 | Sommer et al. | 714/719 |
| 7,992,070 B2 * | 8/2011 | Djordjevic et al. | 714/755 |
| 8,051,355 B2 * | 11/2011 | Taubin et al. | 714/752 |
| 2003/0021355 A1 * | 1/2003 | You | 375/267 |
| 2005/0174983 A1 * | 8/2005 | Naguleswaran et al. | 370/347 |
| 2010/0146365 A1 * | 6/2010 | Yano et al. | 714/752 |

* cited by examiner

FIG. 1

| Bits | Level | Voltage |
|------|-------|---------|
| 1000 | 15 | 1.00 |
| 1001 | 14 | 0.93 |
| 1011 | 13 | 0.87 |
| 1010 | 12 | 0.80 |
| 1110 | 11 | 0.73 |
| 1111 | 10 | 0.67 |
| 1101 | 9 | 0.60 |
| 1100 | 8 | 0.53 |
| 0100 | 7 | 0.47 |
| 0101 | 6 | 0.40 |
| 0111 | 5 | 0.33 |
| 0110 | 4 | 0.27 |
| 0010 | 3 | 0.20 |
| 0011 | 2 | 0.13 |
| 0001 | 1 | 0.07 |
| 0000 | 0 | 0.00 |

| Bit | Hard-Decision | Reliability | LLR |
|-----|---------------|-------------|-----|
| 3 (MSB) | 0 | 1.00 | -140.2 |
| 2 | 0 | 1.00 | -30.6 |
| 1 | 0 | 0.99 | -5.4 |
| 0 (LSB) | 0 | 0.56 | -0.2 |

| RS/BCH Bits | LDPC Bits | Level | Voltage |
|---|---|---|---|
| 10 | 00 | 15 | 1.00 |
| 10 | 01 | 14 | 0.93 |
| 10 | 11 | 13 | 0.87 |
| 10 | 10 | 12 | 0.80 |
| 11 | 10 | 11 | 0.73 |
| 11 | 11 | 10 | 0.67 |
| 11 | 01 | 9 | 0.60 |
| 11 | 00 | 8 | 0.53 |
| 01 | 00 | 7 | 0.47 |
| 01 | 01 | 6 | 0.40 |
| 01 | 11 | 5 | 0.33 |
| 01 | 10 | 4 | 0.27 |
| 00 | 10 | 3 | 0.20 |
| 00 | 11 | 2 | 0.13 |
| 00 | 01 | 1 | 0.07 |
| 00 | 00 | 0 | 0.00 |

FIG. 4

| RS/BCH Bits | LDPC Bits | Voltage |
|---|---|---|
| 00 | 00 | 1.00 |
|  | 01 | 0.93 |
|  | 11 | 0.87 |
|  | 10 | 0.80 |
| 01 | 00 | 0.73 |
|  | 01 | 0.67 |
|  | 11 | 0.60 |
|  | 10 | 0.53 |
| 10 | 00 | 0.47 |
|  | 01 | 0.40 |
|  | 11 | 0.33 |
|  | 10 | 0.27 |
| 11 | 00 | 0.20 |
|  | 01 | 0.13 |
|  | 11 | 0.07 |
|  | 10 | 0.00 |

FIG. 5A

| RS/BCH Bits | LDPC Bits | Voltage |
|---|---|---|
| 0 | 00 | 1.00 |
|  | 01 | 0.86 |
|  | 11 | 0.71 |
|  | 10 | 0.57 |
| 1 | 00 | 0.43 |
|  | 01 | 0.29 |
|  | 11 | 0.14 |
|  | 10 | 0.00 |

CODING ARCHITECTURE FOR MULTI-LEVEL NAND FLASH MEMORY WITH STUCK CELLS

CROSS REFERENCE TO OTHER APPLICATIONS

This application is a continuation of co-pending U.S. patent application Ser. No. 12/313,512, entitled CODING ARCHITECTURE FOR MULTI-LEVEL NAND FLASH MEMORY WITH STUCK CELLS filed Nov. 19, 2008 which is incorporated herein by reference for all purposes, which claims priority to U.S. Provisional Patent Application No. 61/126,937 entitled A CODING ARCHITECTURE FOR MULTI-LEVEL NAND FLASH MEMORY WITH STUCK CELLS filed May 7, 2008 which is incorporated herein by reference for all purposes.

BACKGROUND OF THE INVENTION

Data may be stored in a variety of ways, including in flash cells in a flash-based storage system. A flash-based storage system allows multiple levels (i.e., voltages) to be written to each flash cell or transistor. If M voltage levels can be reliably written and read back from each flash cell, then the system can store $\log_2 M$ bits/cell. As the capacity increases, the probability of a readback error increases, thus dictating the use of stronger error correction codes. One such class of codes includes low density parity check (LDPC) codes. LDPC codes enable soft information (i.e., bit reliabilities) to be used to improve decoding performance. A statistical characterization of the read channel is needed to form the bit reliabilities. A problem with the use of LDPC codes arises when the readback sequence of data includes voltages which do not conform to the long-term read channel statistics. One case of this is a stuck cell in NAND flash, in which the readback voltage is independent of the written data. Stuck cells occur as a result of manufacturing defects/flaws, or aging/deterioration of cells. In some cases, for example, when a cell is stuck, the readback voltage is always 0 for that cell and is independent of any read channel statistics. The presence of stuck cells can severely degrade system performance.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
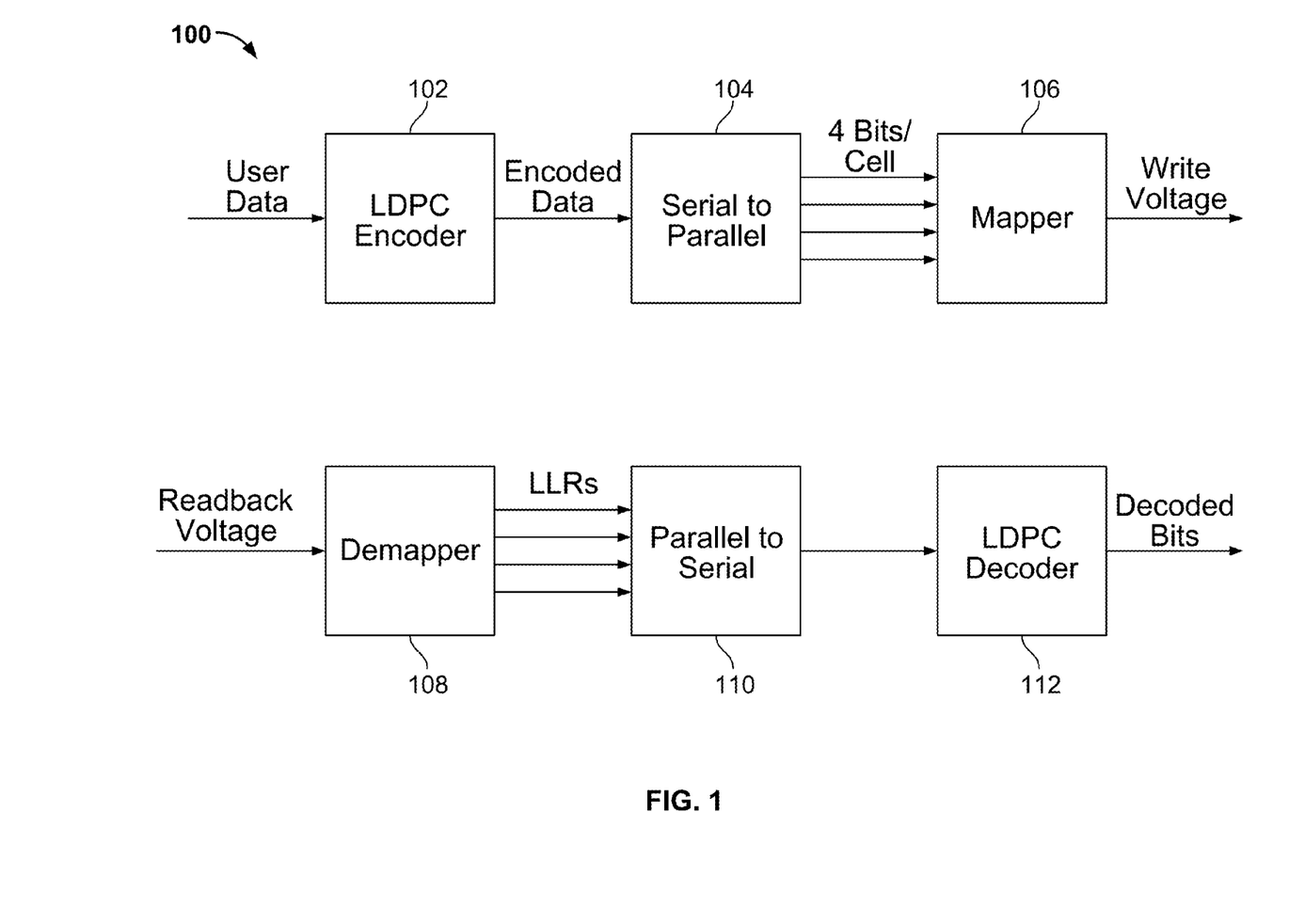
FIG. 1 is a block diagram illustrating an embodiment of a system for writing and reading back data.

FIG. 1 is a block diagram illustrating an embodiment of a system for writing and reading back data. In this example, system 100 is a bit-interleaved coded modulation (BICM) system. Here the coded bits are applied directly to the mapper 106. An interleaver is implicit in the LDPC code design whereby every bit has a similar correction capability. This is in contrast to trellis-coded or set-partitioned designs where sub-sets of bits are more strongly protected. System 100 is shown to include a write system (top) and a read system (bottom). The write system includes LDPC encoder 102, serial to parallel block 104, and mapper 106. The read system includes demapper 108, parallel to serial block 110, and LDPC decoder 112. To write data, in this example, user data is provided as input to LDPC encoder 102, which outputs encoded data. The encoded data is provided as input to serial to parallel block 104, which outputs four bits of data in parallel, for the case of four bits stored per (flash) cell. The parallel data is provided as input to mapper 106, which provides a write voltage to be applied to a cell. To read data from a cell, a voltage is read back from the cell and provided as input to demapper 108. Demapper 108 outputs four log likelihood ratios (LLRs) or bit reliabilities, which are input to parallel to serial block 110. The serialized output of parallel to serial block 110 is input to LDPC decoder 112, which outputs the decoded bits.

In a soft decision coded system that employs soft information such as system 100, a large error can cause a bit to be labeled as being reliable even when it is in error (e.g., a large LLR of the wrong sign). Errors of this type can cause an LDPC code to fail, hence if they occur often enough, the system performance will be degraded.

Figure 2A:
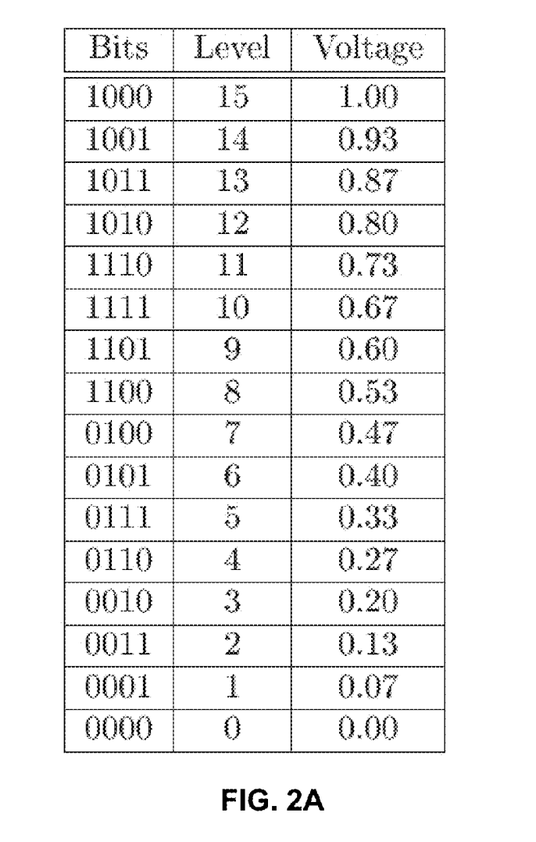
FIG. 2A is an example bit mapping table for a flash cell.

FIG. 2A is an example bit mapping table for a flash cell. In this example, a Gray code mapping is used to map from bits to levels for a 16-level (4 bits/cell) multi-level system. Gray code mapping means that only one bit changes when going between adjacent levels. This mapping could be used in a bit-interleaved coded modulation (BICM) system, such as that shown in FIG. 1. For example, mapper 106 and demapper 108 could use this mapping scheme. In this example, the channel voltages are normalized to a 1 volt range, but the range may vary in some other embodiments.

As an example, to store the bits [1, 0, 0, 1] in this cell, level 14 or 0.93V would be written. When this cell is read back, a voltage in the region of 0.93V is read in most cases. However, if this cell is a stuck cell, then a voltage with a significant deviation from the write voltage, for example 0.03V, may be observed. In a hard decision coded system, this readback error would cause [0, 0, 0, 0] to be selected because [0, 0, 0, 0] is the closest to 0.03V in the table, so there would be two bit errors (the MSB and the LSB). However, with sufficient redundancy in the hard decision code, the two bit errors can be corrected.

Figure 2B:
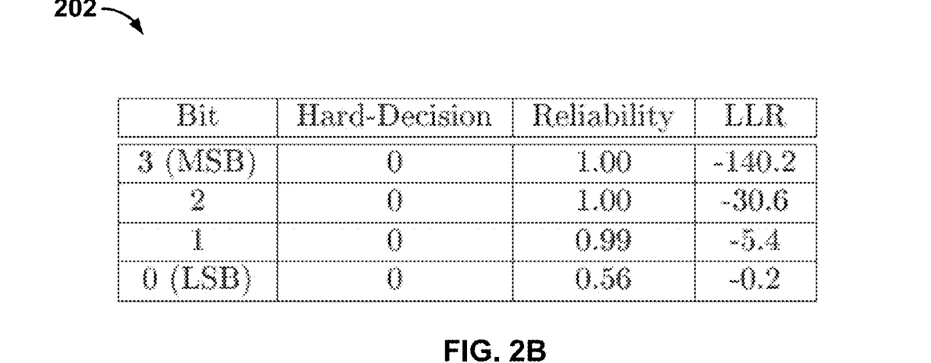
FIG. 2B is an example of readback information associated with a stuck cell.

In a soft decision coded system, such as system 100, the bit reliabilities produced by demapper 108 are shown in FIG. 2B.

FIG. 2B is an example of readback information associated with a stuck cell. Table 202 shows the (bit) reliabilities produced by demapping a voltage of 0.03V on an AWGN (additive white Gaussian noise) channel with σ=0.03V. Each bit reliability is the probability that the bit is 0. The log-likelihood ratio is defined in this example as $$LLR = \log\left(\frac{Pr[\text{bit} = 1]}{Pr[\text{bit} = 0]}\right),$$

where Pr is the probability. In this case, what was written was [1, 0, 0, 1] or 0.93V and what was read back was 0.03V. In other words, 0.03V was input to demapper 108, which outputted the bit reliabilities 1.00, 1.00, 0.99, and 0.56, for bits 3, 2, 1, and 0, respectively, as shown in table 202. As shown, the most significant bit (MSB), or bit 3, is being presented to the decoder as a certain 0 (reliability 1.00), since levels that have a 1 in that bit position are at a significant distance from [0, 0, 0, 0] and hence very unlikely. In reality, bit 3 is in fact a 1 and should have a low reliability value. Bit 2 is 0 with a reliability of 1.00. Bit 1 is 0 with a reliability of 0.99. Bit 0, the least significant bit (LSB), is 0 with a reliability of 0.56.

Because bits 3 and 2 have such a low LLR, an LDPC decoder may not be able to correct these bits. In this particular example, bit 2 does not require correction (since it is actually a 0) but bit 3 requires correction since it is actually a 0. Bits 1 and 0 have a higher LLR, so they still may be correctable by an LDPC decoder. In some cases, an LDPC decoder is not able to correct bits with an LLR<−10. As such, if the hard decision is [0, 0, 0, 0], the output of the LDPC decoder may be [0, 0, 0, 1] even though it should be [1, 0, 0, 1]. Thus, in this example, there would be one bit error.

In some embodiments, saturation of the LLRs is performed so that the error can be corrected by the LDPC, but at the expense of decoder performance. Saturation means that the value of each LLR is limited to above and/or below certain value(s) or saturation point(s). For example, if the saturation point is −5, then if the LLR is less than −5, the LLR is set equal to −5. A saturation point can be selected that helps flip stuck bits associated with stuck cells, but performance is reduced when using saturation.

Figure 3:
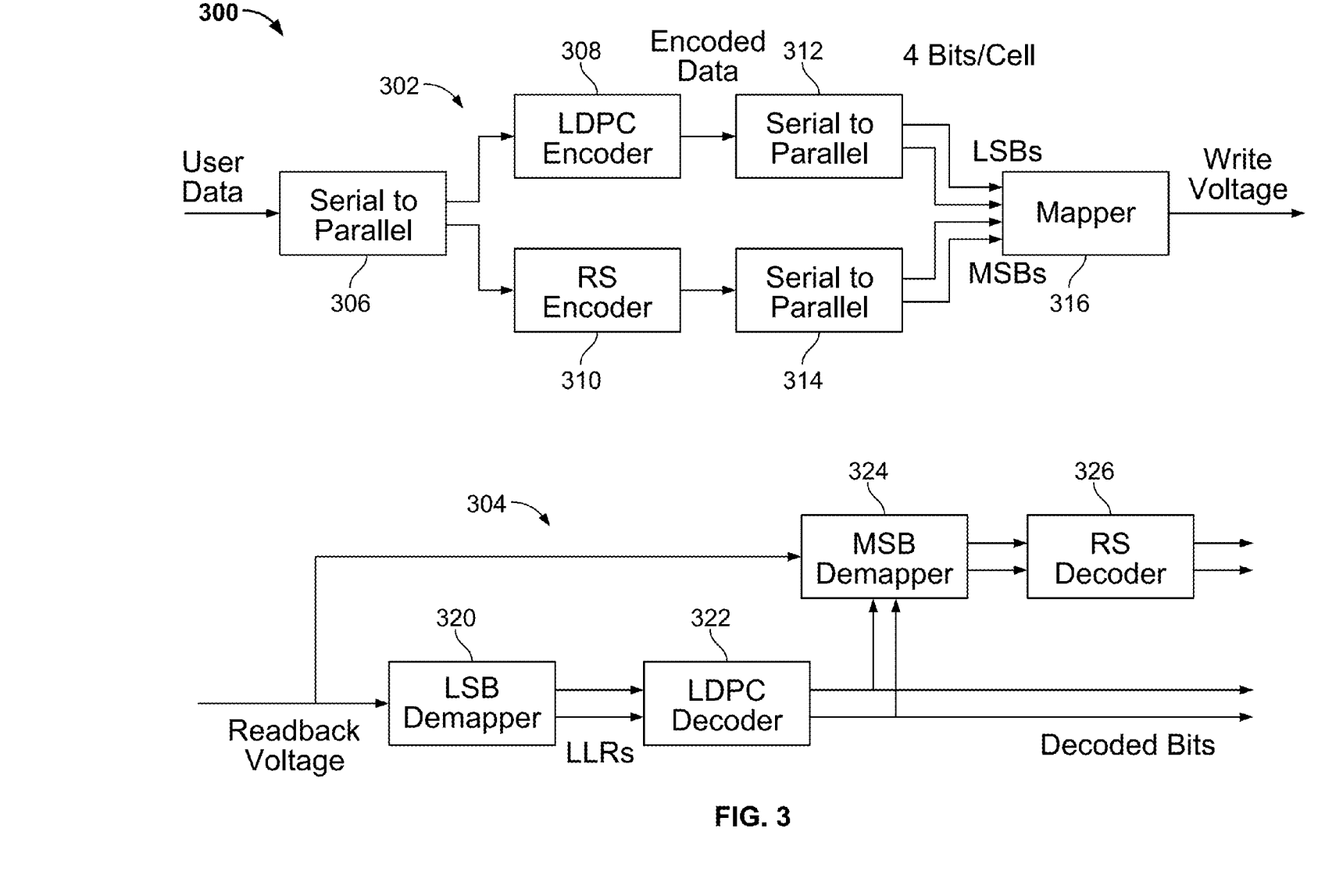
FIG. 3 is a block diagram illustrating an embodiment of a hybrid system for reading and writing data.

FIG. 3 is a block diagram illustrating an embodiment of a hybrid system for reading and writing data. System 300 is a hybrid system because one or more of the bits are encoded using a first encoder and one or more of the bits are encoded using a second encoder. In this example, the first encoder is an LDPC encoder and the second encoder is a Reed Solomon (RS) encoder. In some other embodiments, the first and/or second encoder uses a different type of code than this example. In this example, system 300 is shown to include a write system 302 and a read system 304. Write system 302 includes serial to parallel block 306, LDPC encoder 308, RS encoder 310, serial to parallel blocks 312 and 314, and mapper 316. Read system 304 includes LSB demapper 320, LDPC decoder 322, MSB demapper 324, and RS decoder 326.

To write data in this example, user data is provided as input to serial to parallel block 306, which outputs a first set of data to be input to LDPC encoder 308 and a second set of data to be input to RS encoder 310. In this example, the first set of data comprises the two LSBs in a group of 4 adjacent bits and the second set of data comprises the two MSBs in the same group of 4 bits. LDPC encoder 308 outputs encoded data to serial to parallel block 312, which outputs two parallel, encoded LSBs to mapper 316. RS encoder 310 outputs encoded data to serial to parallel block 314, which outputs two parallel, encoded MSBs to mapper 316. Mapper 316 outputs a voltage based on a mapping scheme, as more fully described below. The voltage is applied to the cell.

To read data from the cell, a readback voltage is read back from the cell and provided as input to LSB demapper 320 and MSB demapper 324. LSB demapper 320 outputs two log likelihood ratios (LLRs) or bit reliabilities corresponding to the two LSB, which are input to LDPC decoder 322. In some embodiments, LSB demapper 320 is implemented using a lookup table. LDPC decoder 322 outputs two decoded LSBs, which are input to MSB demapper 324 and output from read system 304. MSB demapper 324 outputs two encoded MSBs based on the two decoded LSBs and the readback voltage. In some embodiments, MSB demapper 324 outputs as the encoded MSBs the RS bits that: (1) correspond to the voltage level that is closest to the readback voltage and (2) have as the LSBs the two decoded LSBs. The encoded MSBs are input to RS decoder 326, which outputs the decoded MSBs.

In read system 304, decoding is performed in multiple stages. In other words, LDPC decoder 322 first decodes a first set of bits (i.e., the LSBs) and then RS decoder 326 decodes a second set of bits (i.e., the MSBs). This is because the input to RS decoder 326 is affected based on the decoded LSBs.

Although the examples described herein include two bits/cell or four bits/cell, the techniques described herein may be applied to any number of bits/cell. For example, some systems may use eight or 16 bits/cell. Similarly, how bits are divided or grouped varies from embodiment to embodiment. In the case of an eight bit cell, in some embodiments two of the eight bits are MSBs (i.e., encoded using one encoder) and the other six are LSBs (i.e., encoded using another encoder). In some other embodiments, four of the eight bits are MSBs and the other four bits are LSBs.

Although system 300 includes LDPC and RS encoders and decoders, in various embodiments other types of codes may be used. For example, instead of the RS code, a BCH code or other hard decision code may be used. For example, instead of the LDPC code, any code that is described by a parity check matrix, a soft decision Reed Solomon code, or other soft decision code may be used.

Figure 4:
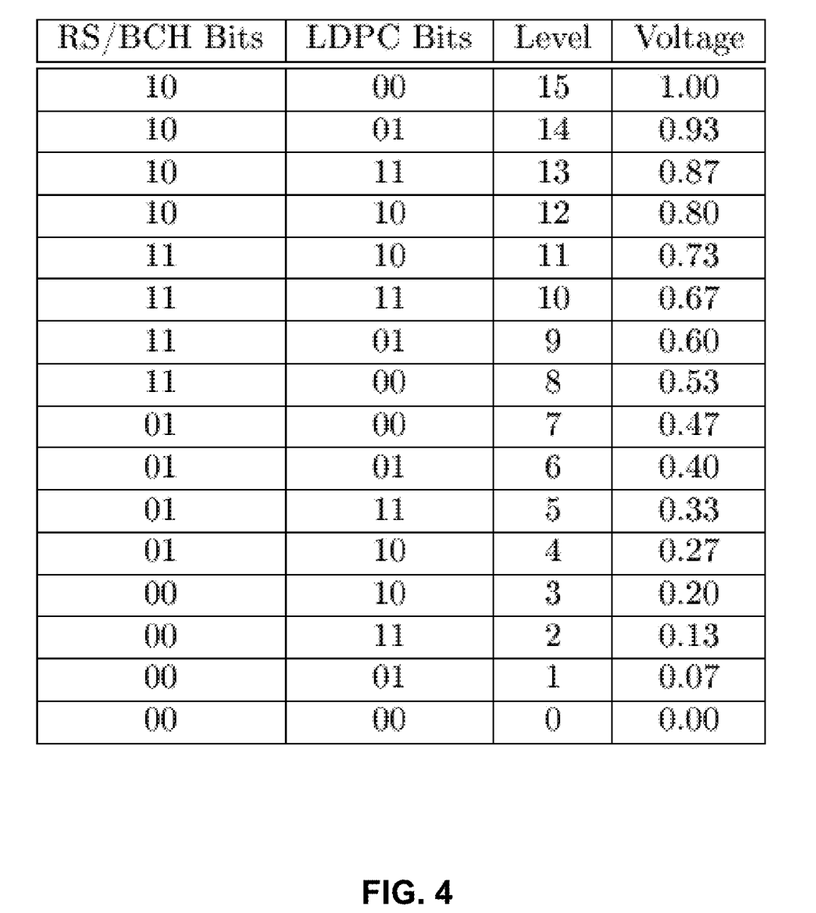
FIG. 4 is an example hybrid mapping table for a flash cell.

FIG. 4 is an example hybrid mapping table for a flash cell. In this example, a Gray code mapping is used to map from bits to voltage levels for a 16-level (i.e., 4 bits/cell) multi-level system. This mapping could be used in a hybrid system, such as that shown in FIG. 3. For example, mapper 316 and demappers 320 and 324 could use this mapping scheme. In this example, the channel voltages are normalized to a 1 volt range, but the range may vary in other embodiments.

In this example, the two LSBs of each cell are encoded using an LDPC code (see second column from left in table) and the two MSBs of each cell are encoded using an RS or BCH code (see leftmost column in table). For example, LDPC encoder 308 is used to encode the two LSBs and RS encoder 310 is used to encode the two MSBs. In some embodiments, on the encoding side, both the RS and LDPC codeword lengths are chosen to be the same length. In some embodiments, the rates of the RS and LDPC codes are chosen so that the probability of failure of the RS code (including stuck cells) given that the LDPC codeword has been successfully decoded, is approximately the same as the probability of failure of the LDPC code (i.e., neither code is the weak link). In most cases, this design criterion will yield a low rate LDPC code (around rate R≈0.8).

In some embodiments, an overall or average system rate is given, and the rate or redundancy of the RS code is first selected, and then any remaining redundancy is given to the LDPC. As an example, suppose that the desired average system rate is R=0.9 and the same number of bits is used in the LDPC and the RS codes. Based on the statistics of stuck bits, a redundancy or rate (R2) is determined for the RS code such that the RS bits can be corrected. R1, the rate of the LDPC code can then be determined as follows:

$$0.5(R1+R2)=0.9$$

$$R1=1.8-R2$$

The above is one example of determining rates for the soft decision and hard decision codes. In various embodiments, different rates may be used.

On the decoding side, the LDPC bits (i.e., the LSBs in this example) are first decoded without knowledge of the RS code. In FIG. 3 for example, LDPC decoder 322 first decodes the LSBs. In contrast to the BICM example of FIG. 1, the LLRs of the bits involved in the LDPC codeword will have (relatively) small magnitudes, as every allowable readback voltage has nearby write levels with both a 0 and a 1 in those bit locations. Because the LLRs are relatively small, it is easier for the LDPC decoder to successfully decode the LDPC codeword. After the LDPC codeword has been successfully decoded, hard decisions are made on the two MSBs of each cell, which are involved in the RS/BCH code. The bit error rate (BER) of these bits should be very low due to the large separation of the allowable levels given the two LSBs. In the presence of stuck cells, the correction capability of this code will be mostly used to correct bit errors due to stuck cells.

As an example, to store the bits [1, 0, 0, 1] in this cell, a level 14 or 0.93V would be written. When this cell is read back, a voltage in the region of 0.93V is read in most cases. However, if this cell is a stuck cell, then a voltage with a significant deviation from the write voltage, for example 0.03V, may be observed. In the hybrid system of FIG. 3, the readback voltage of 0.03V is input to LSB demapper 320, which outputs LLRs (probabilities associated with the LSBs). LDPC decoder uses the LLRs to decode the LSBs. The LSBs are input to MSB demapper 324, which uses the decoded LSBs and the readback voltage of 0.03V to output the two closest MSBs. In other words, the decoded LSBs are used to help decode the MSBs. By decoding the LSBs first, the options are greatly reduced for the MSBs. For example, if the LSBs were correctly decoded to [0, 1], then the options for the MSBs are reduced to four levels: [1, 0] at voltage 0.93V, [1, 1] at voltage 0.60V, [0, 1] at voltage 0.40V, and [0, 0] at voltage 0.07V. If the readback voltage is 0.03V, then MSB demapper 324 outputs [0, 0] because 0.07V is the closest to 0.03V. [0, 0] is then input into RS decoder 326, which decodes the MSBs. If correctly decoded, the output of RS decoder 326 would then be [1, 0]. In other words, RS decoder 326 corrects [0, 0] to [1, 0].

Although the examples described herein concern component codes applied to either MSBs or LSBs, in various embodiments, other implementations may be used, such as one based on component codes applied to groups of bits that include both MSBs and LSBs. In other words, any appropriate grouping of bits may be used in various embodiments. For example, in a four bits/cell system, the first and third bits may be LDPC bits and the second and fourth bits may be RS/BCH bits. In another example, the MSBs may be LDPC bits and the LSBs may be RS/BCH bits.

Figure 5A:
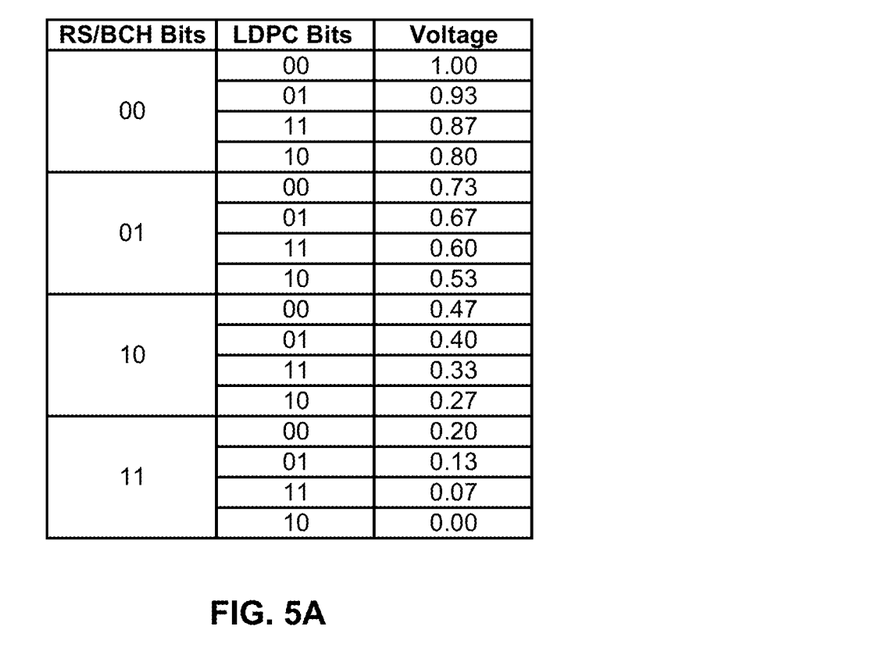
FIG. 5A is another example of a hybrid mapping table for a flash cell.

FIG. 5A is another example of a hybrid mapping table for a flash cell. In this example, a Gray code mapping is used to map the RS/BCH bits and a Gray code mapping is used to map the LDPC bits for a 16-level (4 bits/cell) multi-level system. Returning to the example of FIG. 3, mapper 316 and demappers 320 and 324 could use this mapping scheme. For example, the two LSBs of each cell could be encoded using an LDPC code and the two MSBs of each cell could be encoded using an RS or BCH code.

In some applications, the mapping of FIG. 5A may have characteristics that are more attractive compared to the mapping of FIG. 4. Because the LDPC bits are Gray code mapped, the distance between repeating LDPC bits is always four levels. For example, if the LDPC bits are decoded as [0, 1], then the four possible levels are [0, 0, 0, 1], [0, 1, 0, 1], [1, 0, 0, 1], and [1, 1, 0, 1], which are four levels apart from each other. Stated another way, the four possible levels are equally and maximally separated from each other in contrast to the mapping of FIG. 4. For example, in FIG. 4, if the LDPC bits are [0, 1], then the four possible levels are [1, 0, 0, 1], [1, 1, 0, 1], [0, 1, 0, 1], and [0, 0, 0, 1]. [1, 1, 0, 1] and [0, 1, 0, 1] are three levels apart, while 1001 and 1101 are five levels apart. In some applications it may be desirable to have equal and maximum separation.

In some embodiments, MSB demapper 324 is a slicer with four sets of thresholds that are selected by the two LSBs. For example, if the LDPC decoder outputs [0, 1], then the set of thresholds selected would be those halfway between the voltages corresponding to [0, 0, 0, 1], [0, 1, 0, 1], [1, 0, 0, 1], and [1, 1, 0, 1], creating four bins whose boundaries are the thresholds. The MSBs output by demapper 324 would be determined based on the bin that the readback voltage falls in.

If BCH coding is used, Gray code mapping the RS/BCH bits may help performance since if there is a partially stuck cell, the BCH code can help correct it. In some cases the RS/BCH bits are not Gray code mapped. For example, if RS coding is used, performance is not necessarily affected by whether or not the RS/BCH bits are Gray code mapped.

Although the examples described herein include Gray code mapping, various mappings may be used in various embodiments. For example, the LSB mapping may be Gray code mapped, while the MSBs may be mapped using another mapping scheme. Furthermore, a particular group of bits and their associated mapping may span multiple NAND flash cells.

Figure 5B:
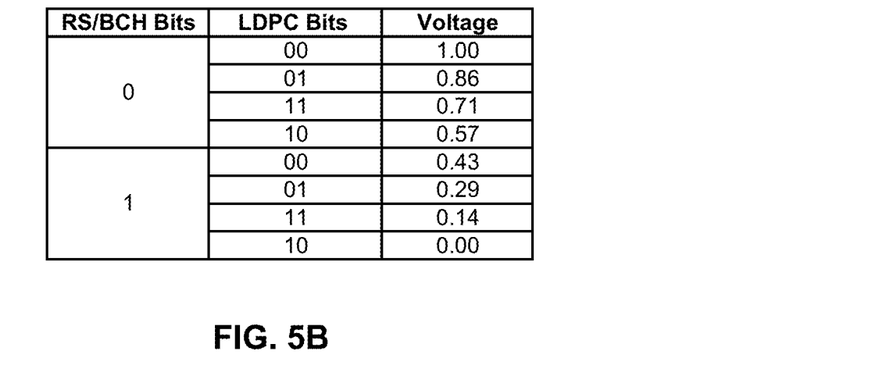
FIG. 5B is an example of a hybrid mapping table for a flash cell for an eight-level system.

FIG. 5B is an example of a hybrid mapping table for a flash cell for an eight-level system. In this example, a Gray code mapping is used to map the LDPC bits for an 8-level (i.e., 3 bits/cell) multi-level system. As an example, the two LSBs of each cell could be encoded using an LDPC code and the one MSB of each cell could be encoded using an RS or BCH code.

Figure 6:
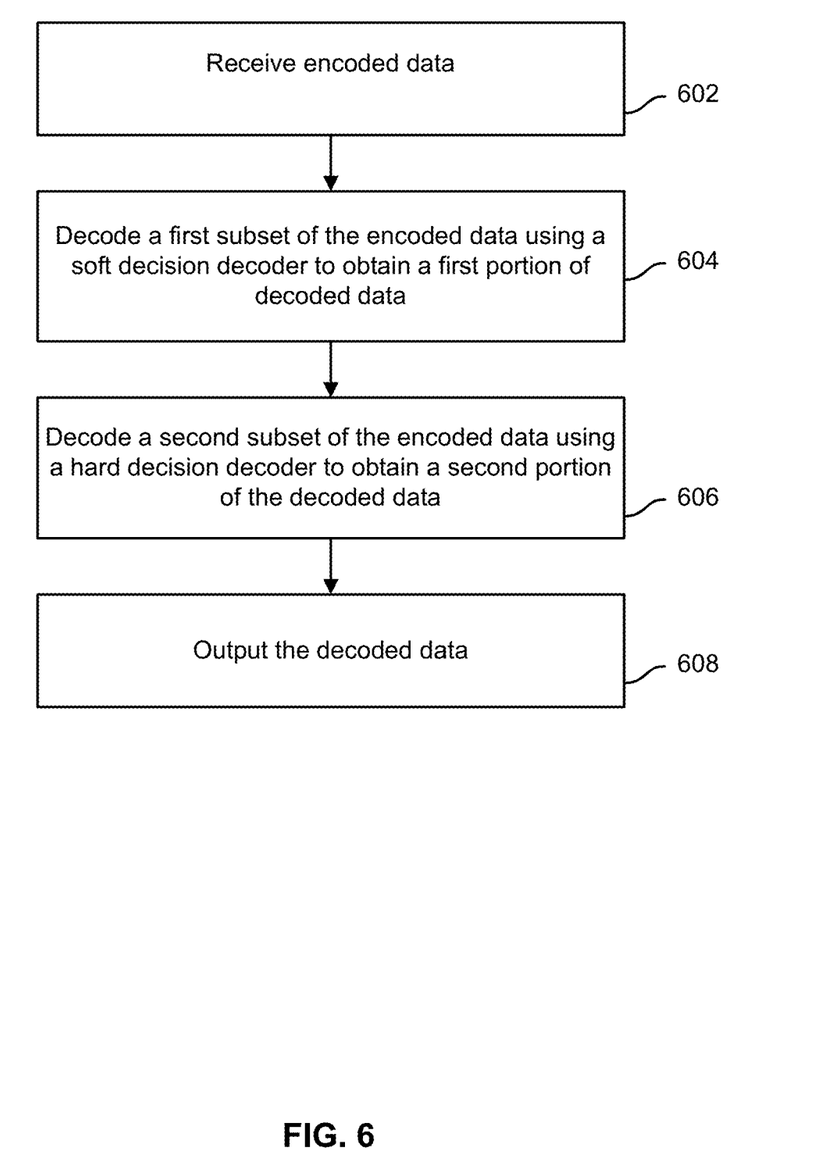
FIG. 6 is a flow chart illustrating an embodiment of a process for decoding data.

FIG. 6 is a flow chart illustrating an embodiment of a process for decoding data. In some embodiments, this process is performed by read system 304 in FIG. 3. At 602, encoded data is received. For example, a readback voltage associated with four bits is received by LSB demapper 320. At 604, a first subset of the encoded data is decoded using a soft decision decoder to obtain a first portion of decoded data. For example, one or more LSBs are decoded using LDPC decoder 322 to obtain the LSBs. At 606, a second subset of the encoded data is decoded using a hard decision decoder to obtain a second portion of the decoded data. For example, the MSBs are decoded using RS decoder 326. In some embodiments, the MSBs are decoded using the decoded LSBs. For example, the decoded LSBs and readback voltage are input to MSB demapper 324, which outputs MSBs, which are input to RS decoder 326. At 608, the decoded data is output. For example, the decoded MSBs and the decoded LSBs are output.

Figure 7:
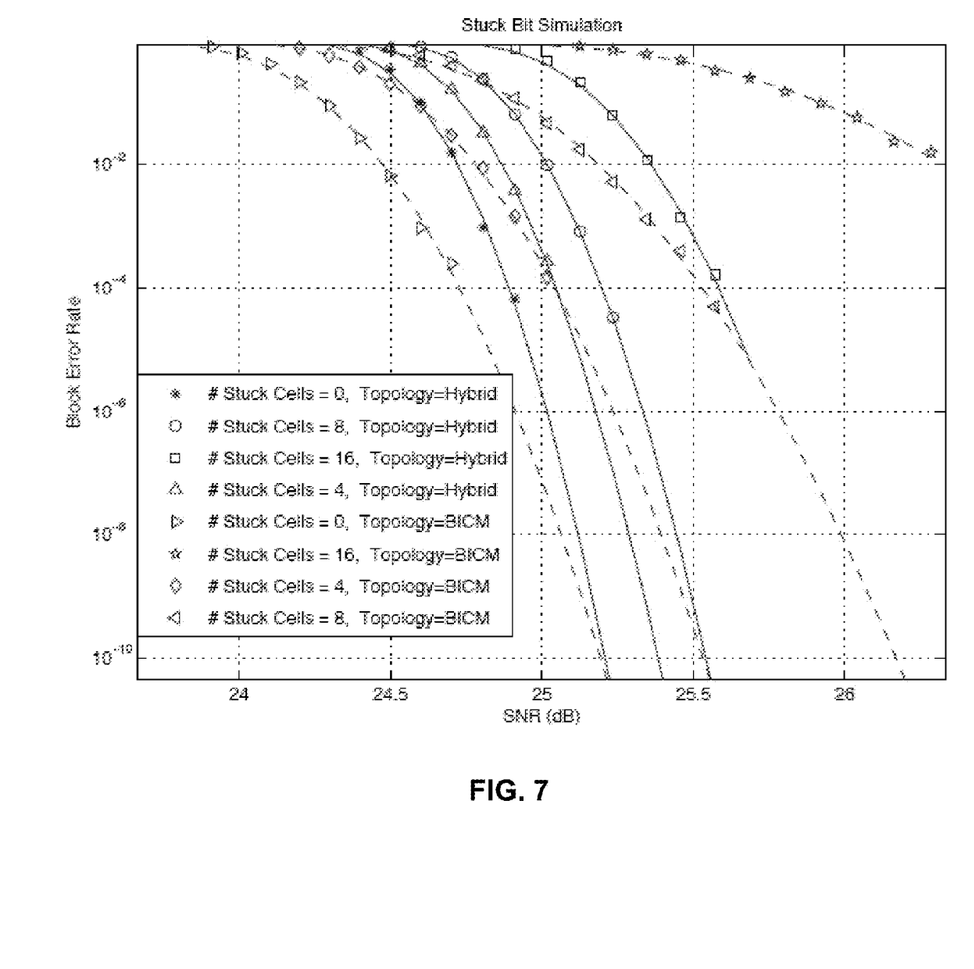
FIG. 7 illustrates an example plot of the performance of hybrid mapping compared to BICM mapping.

FIG. 7 illustrates an example plot of the performance of hybrid mapping compared to BICM mapping. In this example, various 0, 4, 8, and 16 stuck cells have been introduced at random in a hybrid and BICM system. As an example, if $10^{-10}$ is a target block error rate, then the hybrid system can tolerate eight stuck cells at the same SNR (SNR 25.55 dB) at which the BICM system can tolerate only four stuck cells. The greater the number of stuck cells, the greater the difference in SNR between the hybrid and BICM topologies to maintain a particular or desired block error rate.

During manufacturing, stuck cells can be mapped out such that data is not stored in blocks of cells that have too many stuck cells in them. However, this is an expensive process and extra blocks of cells need to be added in order to make up for the loss of storage. Using the techniques disclosed herein, more stuck cells can be tolerated, and therefore fewer blocks need to be mapped out, providing better yield and improving overall efficiency.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method, comprising:
   generating, for a cell, one or more encoded least significant bit values based at least in part on a readback value for the cell;
   using a first decoder to decode the one or more encoded least significant bit values in order to obtain one or more decoded least significant bit values;
   generating, for the cell, one or more encoded most significant bit values based at least in part on (1) the readback value for the cell and (2) the one or more decoded least significant bit values, including by:
      accessing a hybrid mapping table, wherein each entry in the hybrid mapping table includes: (1) a stored voltage level, (2) one or more stored least significant bit values, and (3) one or more stored most significant bit values; and
      outputting, as the one or more encoded most significant bit values, the one or more stored most significant bit values from that entry in the hybrid mapping table that: (1) has one or more stored least significant bit values that match the one or more decoded least significant bit values and (2) has a stored voltage level that is closest to the readback voltage; and
   using a second decoder to decode the one or more encoded most significant bit values in order to obtain one or more decoded most significant bit values.

2. The method recited in claim 1, wherein the first decoder includes one or more of the following: a soft decision decoder, a parity check decoder, or a low density parity check (LDPC) decoder.

3. The method recited in claim 1, wherein the second decoder includes one or more of the following: a hard decision decoder; a Reed Solomon (RS) decoder; or a Bose, Ray-Chaudhuri, Hocquenghem (BCH) decoder.

4. The method recited in claim 1, wherein the first decoder is associated with a first coding rate and the second decoder is associated with a second coding rate that is different from the first coding rate.

5. The method recited in claim 1, wherein the readback value is retrieved from a flash memory.

6. The method recited in claim 1, wherein at least one of: (1) the one or more encoded least significant bit values or (2) the one or more encoded most significant bit values is Gray code mapped.

7. A system, comprising:
   a first hardware demapper which is configured to generate, for a cell, one or more encoded least significant bit values based at least in part on a readback value for the cell;
   a first hardware decoder which is configured to decode the one or more encoded least significant bit values in order to obtain one or more decoded least significant bit values;
   a second hardware demapper which is configured to generate, for the cell, one or more encoded most significant bit values based at least in part on (1) the readback value for the cell and (2) the one or more decoded least significant bit values, including by:
      accessing a hybrid mapping table, wherein each entry in the hybrid mapping table includes: (1) a stored voltage level, (2) one or more stored least significant bit values, and (3) one or more stored most significant bit values; and
      outputting, as the one or more encoded most significant bit values, the one or more stored most significant bit values from that entry in the hybrid mapping table that: (1) has one or more stored least significant bit values that match the one or more decoded least significant bit values and (2) has a stored voltage level that is closest to the readback voltage; and
   a second hardware decoder which is configured to decode the one or more encoded most significant bit values in order to obtain one or more decoded most significant bit values.

8. The system recited in claim 7, wherein the first decoder includes one or more of the following: a soft decision decoder, a parity check decoder, or a low density parity check (LDPC) decoder.

9. The system recited in claim 7, wherein the second decoder includes one or more of the following: a hard decision decoder; a Reed Solomon (RS) decoder; or a Bose, Ray-Chaudhuri, Hocquenghem (BCH) decoder.

10. The system recited in claim 7, wherein the first decoder is associated with a first coding rate and the second decoder is associated with a second coding rate that is different from the first coding rate.

11. The system recited in claim 7 further comprising a flash memory, wherein the readback value is retrieved from the flash memory.

12. The system recited in claim 7, wherein at least one of: (1) the one or more encoded least significant bit values or (2) the one or more encoded most significant bit values is Gray code mapped.

13. A computer program product, the computer program product being embodied in a non-transitory computer readable storage medium and comprising computer instructions for:

generating, for a cell, one or more encoded least significant bit values based at least in part on a readback value for the cell;

decoding the one or more encoded least significant bit values in order to obtain one or more decoded least significant bit values;

generating, for the cell, one or more encoded most significant bit values based at least in part on (1) the readback value for the cell and (2) the one or more decoded least significant bit values, including by:

accessing a hybrid mapping table, wherein each entry in the hybrid mapping table includes: (1) a stored voltage level, (2) one or more stored least significant bit values, and (3) one or more stored most significant bit values; and     outputting, as the one or more encoded most significant bit values, the one or more stored most significant bit values from that entry in the hybrid mapping table that: (1) has one or more stored least significant bit values that match the one or more decoded least significant bit values and (2) has a stored voltage level that is closest to the readback voltage; and decoding the one or more encoded most significant bit values in order to obtain one or more decoded most significant bit values.

14. The computer program product recited in claim 13, wherein the computer instructions for decoding the encoded LSB values include computer instructions for using one or more of the following: a soft decision decoder, a parity check decoder, or a low density parity check (LDPC) decoder.

15. The computer program product recited in claim 13, wherein the computer instructions for decoding the encoded MSB values include computer instructions for using one or more of the following: a hard decision decoder; a Reed Solomon (RS) decoder; or a Bose, Ray-Chaudhuri, Hocquenghem (BCH) decoder.

16. The computer program product recited in claim 13, wherein the encoded LSB values are associated with a first coding rate and the encoded MSB values are associated with a second coding rate that is different from the first coding rate.

17. The computer program product recited in claim 13, wherein the readback value is retrieved from a flash memory.

18. The computer program product recited in claim 13, wherein at least one of: (1) the one or more encoded least significant bit values or (2) the one or more encoded most significant bit values is Gray code mapped.

\* \* \* \* \*